United States Patent
Matsumoto

(10) Patent No.: US 9,481,818 B2
(45) Date of Patent: Nov. 1, 2016

(54) THERMALLY CONDUCTIVE SILICONE COMPOSITION AND A CURED PRODUCT OF SAME

(71) Applicant: SHIN-ETSU CHEMICAL CO., LTD., Tokyo (JP)

(72) Inventor: Nobuaki Matsumoto, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/889,693

(22) PCT Filed: Apr. 17, 2014

(86) PCT No.: PCT/JP2014/060943
§ 371 (c)(1),
(2) Date: Nov. 6, 2015

(87) PCT Pub. No.: WO2014/181657
PCT Pub. Date: Nov. 13, 2014

(65) Prior Publication Data
US 2016/0096984 A1    Apr. 7, 2016

(30) Foreign Application Priority Data
May 7, 2013   (JP) .................. 2013-097693

(51) Int. Cl.
*C09J 183/06*  (2006.01)
*C08L 83/04*   (2006.01)
(Continued)

(52) U.S. Cl.
CPC .............. *C09J 183/06* (2013.01); *C08L 83/04* (2013.01); *C09J 9/00* (2013.01); *C09J 11/04* (2013.01); *C09K 5/08* (2013.01); *H01L 23/296* (2013.01); *C08G 77/12* (2013.01); *C08G 77/20* (2013.01); *C08K 7/18* (2013.01); *C08L 2205/025* (2013.01); *C08L 2205/035* (2013.01)

(58) Field of Classification Search
CPC ......... C08G 77/12; C08G 77/20; C07F 7/21; C08K 5/5435
See application file for complete search history.

(56) References Cited

U.S. PATENT DOCUMENTS

| 2003/0049466 A1 | 3/2003 | Yamada et al. |
| 2012/0119137 A1 | 5/2012 | Tsuji et al. |
| 2015/0148273 A1 | 5/2015 | Matsumoto et al. |

FOREIGN PATENT DOCUMENTS

| JP | 4656340 B2    | 1/2011  |
| JP | 2011-122000 A | 6/2011  |
| JP | 2011-246536 A | 12/2011 |
| JP | 3580366 B2    | 10/2004 |
| JP | 2009 209230   | * 9/2009 |

(Continued)

OTHER PUBLICATIONS

JP 2009 209230 machine translation (2009).*

*Primary Examiner* — Kuo-Liang Peng
(74) *Attorney, Agent, or Firm* — Birch, Stewart, Kolasch & Birch, LLP

(57) ABSTRACT

Thermally-conductive silicone composition, a cured material of which does not impose stress to integrated-circuit packages even upon standing at high temperature, and semi-conductor device provided with cured material obtained by curing the composition, the composition comprising (A) 100 parts by mass of an organopolysiloxane having ≥2 alkenyl groups per molecule and a dynamic viscosity at 25° C. of 10-100,000 mm²/s, (B) an organohydrogenpolysiloxane of formula (1):

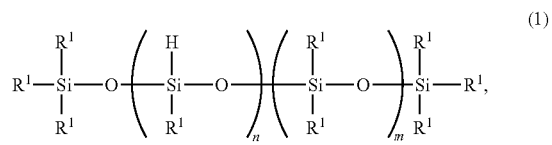

(C) an organohydrogenpolysiloxane of formula (2):

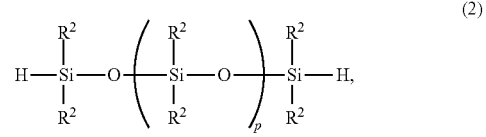

(D) an organohydrogenpolysiloxane of formula (3):

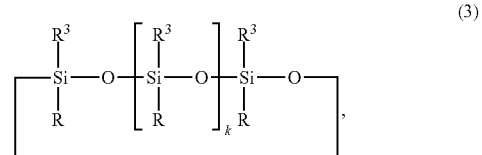

(E) 400-3000 parts by mass of thermally conductive filler,
(F) a catalytic amount of platinum group metal catalyst, and
(G) 0.01-1 part by mass of reaction retardant,
wherein the variables in formulas (1)-(3) are as defined in the specification and the amounts of components (B)-(D) enable satisfaction of the relationships regarding Si—H groups and alkenyl groups in components (A)-(D) are as defined in the specification.

7 Claims, No Drawings

(51) Int. Cl.
*C09J 9/00* (2006.01)
*C09J 11/04* (2006.01)
*C09K 5/08* (2006.01)
*H01L 23/29* (2006.01)
*C08G 77/12* (2006.01)
*C08G 77/20* (2006.01)
*C08K 7/18* (2006.01)

(56) References Cited

FOREIGN PATENT DOCUMENTS

| | | |
|---|---|---|
| JP | 2012-102283 A | 5/2012 |
| JP | 5182515 B2 | 1/2013 |
| WO | WO 2013/161436 A1 | 10/2013 |

* cited by examiner

THERMALLY CONDUCTIVE SILICONE COMPOSITION AND A CURED PRODUCT OF SAME

FIELD OF THE INVENTION

The present invention relates to a thermally conductive silicone composition which has a bonding function strong enough to follow large warping of an IC package, and whose softness remains even after left at a high temperature, and a cured material therefrom.

PRIOR ART

A lot of electronic devices are being used more and more in various fields such as the auto industry and the car electronic industry. Thus, semi-conductive devices are being introduced in most fields of industry. Typical semi-conductive devices are composed of an IC package and a heat radiation part which is to let heat leave from a surface of the IC package. An IC package, i.e., heat generating part, is bonded to a heat radiation part by letting a thermally conductive silicone composition flow into a gap between the heat generating part and the heat radiation part, and then heat-curing the composition, whereby micro unevenness present on surfaces of the IC package and the heat radiation part is filled in (see the following Patent Literature 1). A cured thermally conductive silicone composition is soft and, therefore, gives less stress on the IC package and, moreover, a pumping-out phenomenon occurs scarcely. Accordingly, the thermally conductive silicone composition is useful.

Recently, amounts of heat emitted in semi-conductive devices are becoming larger, so that a thermal conductivity of the previous thermally conductive silicone composition is not enough. To cope with this problem, a high-boiling solvent is incorporated in a thermally conductive silicone composition to attain a higher conductivity (see the following Patent Literature 2). It is also known that a silicone oil is incorporated in a thermally conductive silicone composition to attain a higher conductivity and softness in a cured material (see the following Patent Literature 3).

PRIOR LITERATURES

Patent Literatures

1. Japanese Patent No. 3580366
2. Japanese Patent No. 4656340
3. Japanese Patent No. 5182515

DISCLOSURE OF THE INVENTION

Problems to be Solved by the Invention

High reliability and high thermal resistance of thermally conductive silicone compositions are required mainly in the field of auto electronics. For instance, when a substrate on which an IC package is mounted warps largely, detachment might occur at an interface between a cured thermally conductive silicone composition and a heat radiation part, or at an interface between a cured thermally conductive silicone composition and an IC package. All of the thermally conductive silicone compositions described in the aforementioned Patent Literatures lack a bonding function and, therefore, cannot bond to a substrate, though it can adhere closely to a substrate. Accordingly, when a substrate warps largely, a cured material cannot follow the warping.

The present inventors tried to add an adhesion aid to the composition in order to solve the aforesaid problem. However, when the composition comprising an adhesion aid is left at a high temperature, a cured material loses its softness so as to give stress to the IC package. This might result in breakdown in a worst case.

Then, the present inventors added an adhesion aid and others to a thermally conductive silicone composition, but could not solve the aforesaid problem. Accordingly, it is still desired to provide a thermally conductive silicone composition which gives a cured material which maintains its initial softness even after left at a high temperature and can follow large warping of a substrate so as not to cause detachment at an interface with the substrate.

Under the aforesaid situation, a purpose of the present invention is to provide a thermally conductive silicone composition which gives a cured material which does not give stress to an IC package, even left at a high temperature.

Means to Solve the Problems

The present inventors have thought that if a liquid thermally conductive silicone composition is made to flow into a gap between the heat generating part and the heat radiation part, and then cured, a cured material has a bonding function so as to be able to follow warping of a substrate; further, the cured material maintains its initial flexibility even left at a high temperature and, therefore, does not give stress to an IC package. The present inventors have further made research to attain the aforesaid purpose and have found that if an organohydrogenpolysiloxane having a structure represented by the following formula (3) is added to a thermally conductive silicone composition, a cured material from the composition maintains its initial flexibility and bonds to a substrate even left at a high temperature and, thus, have made the present invention.

The present invention provides a silicone composition having a viscosity at 25 degrees C. of 10 to 1,000 Pa·s, and comprising (A) 100 parts by mass of an organopolysiloxane having at least two alkenyl groups per molecule and a dynamic viscosity at 25 degrees C. of 10 to 100,000 mm$^2$/s, (B) an organohydrogenpolysiloxane represented by the following formula (1):

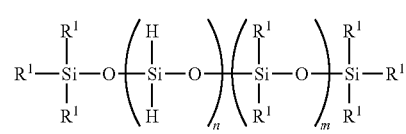

(1)

wherein n and m are positive integers which meet the equations:
$10 \leq n+m \leq 100$ and $0.01 \leq n/(m+n) \leq 0.3$, and
$R^1$ is, independently of each other, an alkyl group having 1 to 6 carbon atoms, (C) an organohydrogenpolysiloxane represented by the following formula (2):

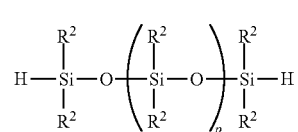

(2)

wherein p is a positive integer of from 5 to 1,000, and $R^2$ is, independently of each other, an alkyl group having 1 to 6 carbon atoms, (D) an organohydrogenpolysiloxane represented by the following formula (3):

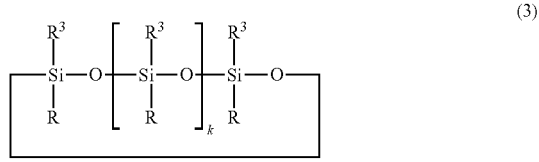

(3)

wherein k is a positive integer of from 2 to 10; R is, independently of each other, a hydrogen atom or $R^4$, provided that two of R are a hydrogen atom, wherein $R^4$ is a group bonded to a silicon atom via a carbon atom or via a carbon atom and an oxygen atom and has a group selected from an epoxy group, an acryloyl group, a methacryloyl group, an ether group and a trialkoxysilyl group. $R^3$ is, independently of each other, an alkyl group having 1 to 6 carbon atoms, (E) 400 to 3,000 parts by mass of a thermally conductive filler, (F) a catalytic amount of a platinum group metal catalyst, and (G) 0.01 to 1 part by mass of a reaction retardant, wherein amounts of components (B), (C) and (D) meet the following conditions:

a ratio, [the total number of Si—H groups in components (B), (C) and (D)]/[the number of alkenyl groups in component (A)], is in a range of 0.6 to 1.5;

a ratio, [the total number of Si—H groups in components (C) and (D)]/[the number of Si—H groups in component (B)], is in a range of 1 to 10; and a ratio, [the number of Si—H groups in component (C)]/[the number of Si—H groups in component (D)], is in a range of 1 to 10.

The present invention also provides a semi-conductor device provided with a cured material obtained by curing the aforesaid composition.

Effects of the Invention

A cured material from the present thermally conductive silicone composition has a better bonding property to a substrate, compared to conventional thermally conductive silicone compositions and, accordingly, can follow large warping of an IC package without detachment and, further, maintains flexibility even left at a high temperature, whereby a semi-conductor device with high reliability is provided.

BEST MODE OF THE INVENTION

The invention will be explained in detail.

(A) Organopolysiloxane

Component (A) is an organopolysiloxane having at least two, per molecule, alkenyl groups each bonded to a silicon atom. The organopolysiloxane preferably has a dynamic viscosity at 25 degrees C. of 10 to 100,000 mm²/s, more preferably 100 to 50,000 mm²/s. If the dynamic viscosity is below the lower limit, storage stability of the composition is worse. If the dynamic viscosity is larger than the upper limit, extendability of the composition is worse, which is undesirable. Known organopolysiloxanes may be used as long as they have at least two, per molecule, alkenyl groups bonded each to a silicone atom and the aforesaid dynamic viscosity. The organopolysiloxane may be linear or branched, and might be even a mixture of tow or more organopolysiloxanes having different viscosities. The dynamic viscosity of the organopolysiloxane in the present specification is measured with an Ostwald viscometer at 25 degrees C.

The alkenyl group has preferably 2 to 10 carbon atoms, more preferably 2 to 8 carbon atoms, and may be selected from, for instance, vinyl, ally, 1-butenyl, and 1-hexenyl groups. Among these, a vinyl group is most preferred on account of its easy synthesis and low cost. The alkenyl groups may be present either at terminals or in middle of the molecule, but preferably at terminals in view of flexibility.

Organic groups bonded to silicon atoms, other than the alkenyl group, are preferably a monovalent hydrocarbon group having 1 to 20 carbon atoms, preferably 1 to 10 carbon atoms. The monovalent hydrocarbon group may be, for instance, an alkyl group such as methyl, ethyl, propyl, butyl, hexyl and dodecyl groups; an aryl group such as a phenyl group; an aralkyl group such as 2-phenylethyl and 2-phenylpropyl groups; and a halogen-substituted monovalent hydrocarbon group where a part or the whole of the hydrogen atoms in these hydrocarbon groups are substituted with a halogen atom (s) such as fluorine or bromine atoms, such as fluoromethyl, bromoethyl, chloromethyl, and 3,3,3-trifluoropropyl groups. In particular, at least 90% of the organic groups is preferably a methyl group on account of easy synthesis and costs. Particularly preferred is a dimethylpolysiloxane whose both terminals are capped with dimethylvinylsilyl groups.

(B) Organohydrogenpolysiloxane

Component (B) is an organohydrogenpolysiloxane represented by the following formula (1).

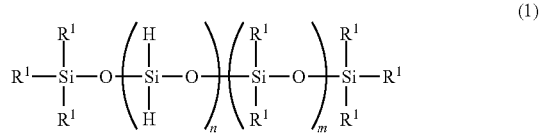

(1)

In formula (1), n and m are positive integers which meet the equations:

10≤n+m≤100, preferably 20≤n+m≤80; and 0.01≤n/(m+n)≤0.3, preferably 0.05≤n/(m+n)≤0.2. If the value, n/(m+n), is less than the lower limit, such a composition cannot be cross-linked into a network state. If the value, n/(m+n), is larger than the upper limit, the amount of Si—H groups which remain unreacted after initial curing is too much, so that excessive cross-linking reaction with water or humid proceeds with time to reduce flexibility of a cured material, which is undesirable.

$R^1$ in formula (1) is, independently of each other, an alkyl group having 1 to 6 carbon atoms, such as methyl, ethyl, propyl, butyl and hexyl groups. In particular, at least 90% of $R^1$ is preferably a methyl group on account of easy synthesis and costs.

Examples of the organohydrogenpolysiloxane represented by formula (1) include

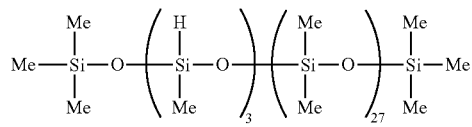

-continued

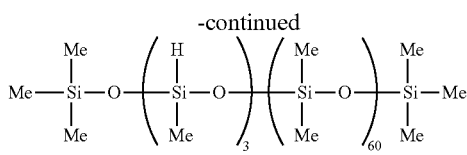

(C) Organohydrogenpolysiloxane

Component (C) is an organohydrogenpolysiloxane represented by the following formula (2).

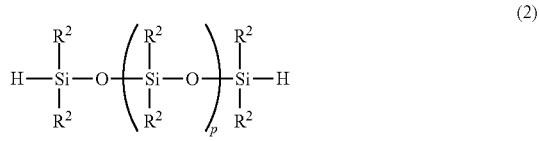

p in formula (2) is a positive integer of from 5 to 1,000, preferably 10 to 100. If p is less than the lower limit, such an organohydrogenpolysiloxane is volatile so that such is not suitable to be used in electronic parts. If p is larger than the upper limit, such an organohydrogenpolysiloxane is viscous so as to be difficult to handle, which is undesirable.

$R^2$ in formula (2) is, independently of each other, an alkyl group having 1 to 6 carbon atoms, such as methyl, ethyl, propyl, butyl and hexyl groups. In particular, at least 90% of $R^2$ is preferably a methyl group on account of easy synthesis and costs.

Examples of the organohydrogenpolysiloxane represented by formula (2) include

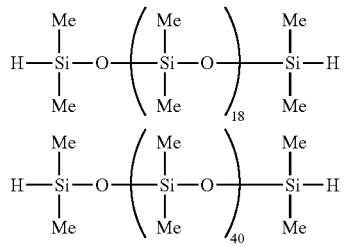

(D) Organohydrogenpolysiloxane

Component (D) is an organohydrogenpolysiloxane represented by the following formula (3).

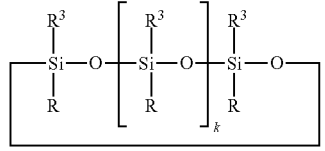

k in formula (3) is a positive integer of from 2 to 10, preferably 2 to 6, more preferably 2 to 4, most preferably 2. R is, independently of each other, a hydrogen atom or $R^4$, provided that two of R are a hydrogen atom. $R^4$ is a group bonded to a silicon atom via a carbon atom or via a carbon atom and an oxygen atom and has a group selected from an epoxy group, an acryloyl group, a methacryloyl group, an ether group and a trialkoxysilyl group. If the organohydrogenpolysiloxane has only one hydrogen atom bonded to a silicon atom, such an organohydrogenpolysiloxane cannot form a crosslinking structure through reaction with the alkenyl groups of component (A). If the organohydrogenpolysiloxane has three or more hydrogen atoms bonded to silicon atoms, a cured material from such an organohydrogenpolysiloxane is too hard, and desired reliability is not secured.

$R^3$ is, independently of each other, an alkyl group having 1 to 6 carbon atoms, such as methyl, ethyl, propyl, butyl and hexyl groups. In particular, at least 90% of $R^3$ is preferably a methyl group on account of easy synthesis and costs.

Examples of $R^4$ include organic groups comprising an epoxy group, such as a 3-glycidoxy propyl group, a 3-glycidoxy propyl methyl group, a 3-glycidoxy ethyl group, and a 3,4-epoxy cyclohexyl ethyl group; organic groups comprising a (meth)acryloyl group, such as a methacryloxy propyl group, a methacryloxy propyl methyl group, a methacryloxy ethyl group, an acryloxy propyl group, an acryloxy propyl methyl group, and an acryloxy ethyl group; organic groups comprising trialkoxysilyl group, such as a methoxysilyl propyl group, a methoxysilyl propyl methyl group, a methoxysilyl ethyl group, a triethoxysilyl propyl group, a triethoxysilyl propyl methyl group, and a triethoxysilyl ethyll group; and orgnic groups comprising an ether group, such as an oxyalkyl group, an alkyloxyalkyl group, a perfluorooxyalkyl group, and a perfluoroalkyl oxyalkyl group.

Among the organohydrogenpolysiloxane represented by formula (3), preferred is a compound represented by the following formula (4).

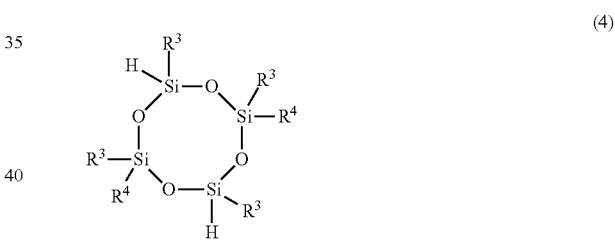

In formula (4), $R^3$ and $R^4$ are as defined above.

Examples of the organohydrogenpolysiloxane represented by formula (4) include the following compounds.

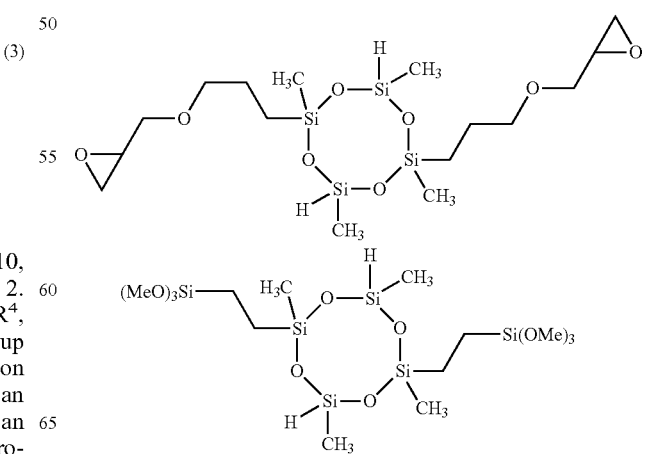

-continued

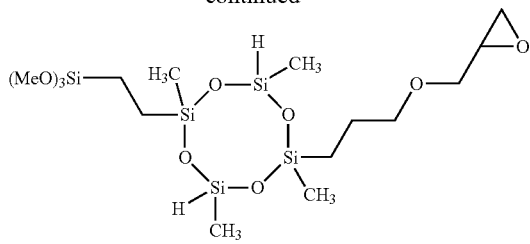

The amounts of components (B), (C) and (D) meet the following condition:

a ratio, [the total number of Si—H groups in components (B), (C) and (D)]/[the number of alkenyl groups in component (A)], is in a range of 0.6 to 1.5, preferably 0.7 to 1.4. If the ratio for the number of Si—H groups is less than the lower limit, a cured material do not have sufficient network structure, so that the cured material does not have sufficient hardness, which is undesirable. If the ration for the number of Si—H groups is larger than the upper limit, a large amount of unreacted Si—H groups remains in a cured material, so that excessive cross-linking reaction with water or humid proceeds and the cured material becomes harder with time to lose its flexibility, which is undesirable.

The amounts of components (B), (C) and (D) meet the following conditions, too:

a ratio, [the total number of Si—H groups in components (C) and (D)]/[the number of Si—H groups in component (B)], is in a range of 1 to 10, preferably 1.2 to 5; and a ratio, [the number of Si—H groups in component (C)]/[the number of Si—H groups in component (D)], is in a range of 1 to 10, preferably 1.2 to 5. If the ratio, (C)+(D) vs. (B), is less than the lower limit, a cured material does not have sufficient flexibility. If the ratio, (C)+(D) vs. (B), is larger than the upper limit, curing is insufficient, which is undesirable. If the ratio, (C) vs. (D), is less than the lower limit, because component (D) has, on a side chain, an easily hydrolyzable group than component (C), a cured material might be poor in heat resistance, which is undesirable. If the ratio, (C) vs. (D), is larger than the upper limit, the present effects of the invention, i.e., a cured material's high flexibility durable at a high temperature and good bonding, are not sufficiently attained.

(E) Thermally Conductive Filler

Component (E) is a filler which is added to give thermal conductivity to the present composition. The thermally conductive filler may be conventional thermally conductive fillers, such as aluminum powder, copper powder, silver powder, nickel powder, gold powder, alumina powder, zinc oxide powder, magnesium oxide powder, aluminum nitride powder, boron nitride powder, silicon nitride powder, diamond powder, carbon powder, indium, and gallium. One or more species of the thermally conductive filler may used. The thermally conductive filler preferably has a thermal conductivity of at least 10 W/mK. If the thermal conductivity is less than 10 W/mK, the thermal conductivity of the silicone composition itself is small, which is undesirable.

An average particle diameter of the thermally conductive filler is preferably 0.1 to 100 micron m, more preferably 0.5 to 90 micron m. If the average particle diameter is small than the lower limit, such a composition is not in a state like grease, so that it is poor in extendability. If the average particle diameter is larger than the upper limit, a heat radiation grease is less homogeneous, which is undesirable. The average particle diameter may be determined as a volume-average value, $D_{50}$, i.e., particle diameter at 50% cumulative volume, or median diameter, in a particle size distribution curve obtained by a laser diffraction method. The filler may be of any shape, such as nonuniform or spherical.

The amount of the thermally conductive filler is in a range of 400 to 3,000 parts by mass, preferably 450 to 2,500 parts by mass, per 100 parts by mass of component (A). If the amount of the thermally conductive filler is less than the lower limit, a cured material does not have a desired thermal conductivity. If the amount of the thermally conductive filler is larger than the upper limit, a composition does not have a state like grease so that it has poor extendibility.

(F) Platinum Group Metal Catalyst

Component (F) is platinum group metal catalyst. The catalyst may any one as long as it can promote addition reaction between the alkenyl groups in component (A) with the Si—H groups in components (B), (C) and (D). Conventional catalyst may be used. In particular, catalyst selected from platinum and platinum compounds are preferred. Examples of the catalyst include platinum including platinum black, elementary platinum group metal, such as rhodium and palladium; platinum chloride, chloroplatinic acid and chloroplatinate, such as $H_2PtCl_4 \cdot nH_2O$, $H_2PtCl_6 \cdot nH_2O$, $NaHPtCl_6 \cdot nH_2O$, $KHPtCl_6 \cdot nH_2O$, $Na_2PtCl_6 \cdot nH_2O$, $K_2PtCl_4 \cdot nH_2O$, $PtCl_4 \cdot nH_2O$, $PtCl_2$, and $Na_2HPtCl_4 \cdot nH_2O$, wherein n is an integer of 0 to 6, preferably 0 or 6; alcohol-modified chloroplatinic acid, complexes of chloroplatinic acid with olefins, platinum group metal, such as platinum black and palladium, supported on a support such as alumina, silica and carbon, rhodium-olefin complexes, chlorotris(triphenyl phosphine) rhodium (or Wilkinson catalyst), and complexes of platinum chloride, chloroplatinic acid or chloroplatinate with vinyl group-containing siloxane. One or more of these platinum group metal catalysts may used.

The amount of component (F) is a catalytically effective amount, and may be such that can promote the reaction of component (A) with components (B), (C) and (D). The amount may be adjusted, depending upon a desired curing rate. In particular, the amount is preferably 0.1 to 500 ppm by mass, more preferably 1 to 400 ppm by mass, of platinum group metal atoms, relative to the mass of component (A). If the amount is less than the lower limit, the catalytic effect is not attained. Even if the amount exceeds the upper limit, the curing rate is not particularly increased.

(G) Reaction Retardant

Component (G) is a reaction retardant. The reaction retardant retards a hydrosilylation at room temperature so as to prolong a shelf life and a pot life. Any reaction retardant may be used as long as it can suppress the catalytic activity of the aforesaid component (F), platinum group metal catalyst. Conventional reaction retardants may be used, such as acetylene compounds such as 1-ethynyl-1-cyclohexan and 3-butine-1-ol; various nitrogen compounds, organic phosphorus compounds, oxime compounds, and organic chloro compounds. Among these, particularly preferred is acetylene alcohol which is not corrosive against metals.

The amount of component (G) is 0.01 to 1 part by mass, preferably 0.05 to 0.9 part by mass, per 100 parts by mass of component (A). If the amount of the reaction retardant is less than the lower limit, it might occur that a sufficient shelf life and a sufficient pot life are not attained. If the amount of the reaction retardant is larger than the upper limit, the curing property of the composition is worse. The reaction retardant may be diluted in use with an organic solvent, such as toluene, xylene and isopropyl alcohol, in order to improve dispersibility in the silicone resins.

(H) Organosilane

The present composition may further comprise organosilane represented by the following formula (5):

$$R^5_a R^6_b Si(OR^7)_{4-a-b} \quad (5)$$

whereby wettability of the filler and the silicone components is improved.

In formula (5), $R^5$ is, independently of each other, a monovalent hydrocarbon group having 6 to 15 carbon atoms, such as hexyl, octyl, nonyl, decyl, dodecyl and tetradecyl groups. If the number of the carbon atoms is less than the lower limit, wettability to the filler is not sufficient. If the number of the carbon atoms is larger than the upper limit, such organosilane is solid at room temperature and, therefore, is inconvenient to handle, and moreover, such a composition has worse low-temperature properties.

In formula (5), a is an integer of 1 to 3; and b is an integer of 0 to 2, where a total of a and b is an integer of 1 to 3. Particularly, a is preferably 1; and b is preferably 0 or 1.

In formula (5), $R^6$ is, independently of each other, a saturated or unsaturated monovalent hydrocarbon group having 1 to 8 carbon atoms, such as alkyl groups, such as methyl, ethyl, propyl, hexyl, and octyl groups; cycloalkyl groups, such as cyclopentyl and cyclohexyl groups; alkenyl groups such as vinyl and ally groups; aryl groups such as phenyl and tolyl groups; aralkyl groups such as 2-phenyl ethyl, and 2-methyl-2-phenylethyl groups; and halogenated hydrocarbon groups such as 3,3,3-trifluoropropyl, 2-(nonafluorobutyl)ethyl, 2-(heptadecafluorooctyl)ethyl, and p-chlorophenyl groups. Among these, particularly preferred are methyl and ethyl groups.

In formula (5), $R^7$ is, independently of each other, a monovalent hydrocarbon group having 1 to 6 carbon atoms, such as alkyl groups, such as methyl, ethyl, propyl, butyl, pentyl and hexyl groups. One or more groups may be selected. Among these, particularly preferred are methyl and ethyl groups.

Examples of the organosilane represented by formula (5) include:

$C_6H_{13}Si(OCH_3)_3$,
$C_{10}H_{21}Si(OCH_3)_3$,
$C_{12}H_{25}Si(OCH_3)_3$,
$C_{12}H_{25}Si(OC_2H_5)_3$,
$C_{10}H_{21}Si(CH_3)(OCH_3)_2$,
$C_{10}H_{21}Si(C_6H_5)(OCH_3)_2$,
$C_{10}H_{21}Si(CH_3)(OC_2H_5)_2$,
$C_{10}H_{21}Si(CH=H_2)(OCH_3)_2$,
$C_{10}H_{21}Si(CH_2CH_2CF_3)(OCH_3)_2$,

The amount of the organosilane is 0.01 to 30 parts by mass, preferably 10 to 25 parts by mass, relative 100 parts by mass of component (A). If the amount of the organosilane is less than the lower limit, it may occur that sufficient wettability is not given to the composition. Even if the amount exceeds the upper limit, the effect does not increase, which is uneconomical.

(I) Organopolysiloxane

The present composition may further comprise organosilane represented by the following formula (6).

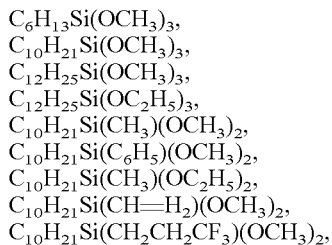

(6)

whereby wettability of the filler and the silicone components is improved.

In formula (6), $R^8$ is, independently of each other, unsubstituted or substituted, monovalent hydrocarbon group having 1 to 18 carbon atoms, preferably 1 to 10 carbon atoms, such as linear alkyl groups, branched alkyl groups, cyclic alkyl groups, alkenyl groups, aryl groups, aralkyl groups, and halogenated alkyl groups. Examples of the linear alkyl groups include methyl, ethyl, propyl, hexyl, and octyl groups. Examples of the branched alkyl groups include isopropyl, isobutyl, tert.-butyl, and 2-ethylhexyl groups. Examples of the cyclic alkyl groups include cyclopentyl and cyclohexyl groups. Examples of the alkenyl groups include vinyl and allyl groups. Examples of the aryl groups include phenyl and tolyl groups. Examples of the aralkyl groups include 2-phenylethyl and 2-methyl-2-phenylethyl groups. Examples of the halogenated alkyl groups include 3,3,3-trifluoropropyl, 2-(nonafluorobutyl)ethyl and 2-(heptadecafluorooctyl)ethy groups. Among these, the preferred $R^8$ is a methyl group or an ethyl group.

In formula (6), $R^9$ is, independently of each other, selected from alkyl, alkoxyalkyl, alkenyl and acyl groups having 1 to 5 carbon atoms. The alky groups may be a linear, branched or cyclic alkyl group, such as those mentioned above for $R^8$. Examples of the alkoxyalkyl group include methoxyethyl and methoxypropyl groups. Examples of the acyl group include acetyl and octanoyl groups. Particularly, $R^8$ is preferably an alkyl group, especially a methyl group or an ethyl group.

In formula (6), q is an integer of from 5 to 100, preferably from 10 to 80. c is an integer of from 1 to 3, preferably 3.

Examples of the organopolysiloxane represented by formula (6) include the following compounds.

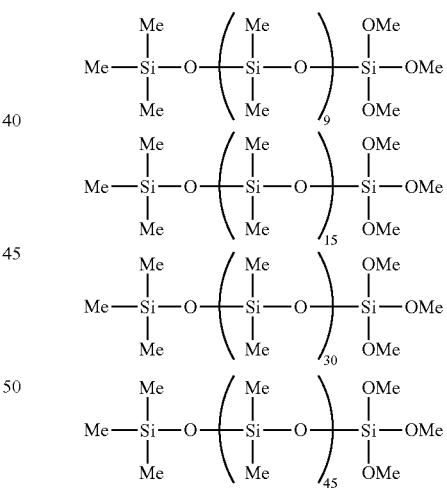

The amount of the organopolysilane is preferably 0.01 to 200 parts by mass, more preferably 0.01 to 150 parts by mass, relative 100 parts by mass of component (A). If the amount of the organopolysilane is less than the lower limit, it may occur that sufficient wettability is not attained. Even if the amount exceeds the upper limit, the effect on wettability does not increase, which is uneconomical.

(J) Fine Silica Powder

The present composition may comprise (J) fine silica powder, whereby the composition is given a property of maintaining a shape. The fine silica powder may be conventional ones used in silicone grease compositions. Particularly, surface-treated fumed silica is preferably used. Dispersibility in components (A) through (D) is improved by surface treatment, so that the powder can be dispersed uniformly in the composition. Further, a property of maintaining a shape is given to a cured product obtained from the composition on account of interaction between the surface-treated fumed silica particles themselves and interaction of surface-treated fumed silica with components (A) through (D).

Examples of an effective surface-treating agent are chlorosilane, silazane and siloxane, more specifically, methyltrichlorosilane, dimethyldichlorosilane, trimethylchlorosilane, hexamethyldisilazane, octamethylcyclotetrasiloxane, and alpha, omega-trimetylsilyldimethylpolysiloxane.

The fine silica powder preferably has a BET specific surface area of at least 50 m$^2$/g, sometimes at least 100 m$^2$/g. If the specific surface area is less than 50 m$^2$/g, a viscosity of the composition is too high so that workability might be worse. The specific surface area of at most 500 m$^2$/g, particularly, at most 300 m$^2$/g, is preferred for a better property of maintaining a shape. The amount of the fine silica powder is 0.1 to 100 parts by mass, preferably 1 to 80 parts by mass, more preferably 1 to 60 parts by mass, per 100 parts by mass of component (A). If the amount is less than the lower limit, it might occur that a cured material does not have a property of maintaining a shape. If the amount is larger than the upper limit, a cured material is not in a state like grease, so that extendability is poor.

The present composition may comprise an additive which is known as an additive for silicone grease, besides the aforesaid components (A) through (J), as long as the effects of the present invention are not interrupted. Examples of the additive include hindered phenol type antioxidants, reinforcing or non-enforcing fillers such as calcium carbonate, polyethers as a thixotropy-enhancing agent. Further, coloring agents such as pigments and dyes may also be added, if desired.

The present silicone composition may comprise components (A) through (G) and, if needed, components (H), (I) and (J), and other additives, and stored at a low temperature for a long period of time as one-package of addition type.

A method for preparing the present silicone composition is not particularly limited, and may be any conventional method. For instance, components (A) and (E) are put in a gate mixer (Planetary Mixer: trade name of Inoue Manufacturing Co.) and, if desired, components (H) and (I) are added and these are mixed at 70 degrees C. for one hour. The mixture is cooled, to which component (G) is then added and mixed at room temperature for 15 minutes. Then, further, component (F) is added and mixed to become homogeneous at room temperature for 15 minutes. Subsequently, components (B), (C) and (D) are added and mixed at room temperature for 15 minutes to obtain the envisaged composition.

The present silicone composition has a viscosity at 25 degrees C. of 10 to 1,000 Pa·s, preferably 50 to 300 Pa·s. The present silicone composition is put in a commercial syringe and applied on a surface of an IC package or on a heat radiation body by extrusion. Accordingly, if the viscosity is lower than the lower limit, the composition may drip after applied, which is undesirable. If the viscosity is larger than the upper limit, an efficiency of work is worse, which is also undesirable. The viscosity in the present specification is measured at 25 degrees C. with a Malcom viscometer, type PC-1T.

Taking stress imposed on an IC package into consideration, it is preferred that a cured material obtained by curing the present silicone composition has a hardness of at most 60, as measured with Asker C (for low hardness), ex Kobunshi Keiki Co.

Conditions for curing the present silicone composition are not particularly limited, and may be such usual for known silicone gels. The present silicone composition may be cured with heat from an IC package, after dispensed. Alternatively, after dispensed, the composition may be actively heated to cure. Heating conditions are preferably 80 to 200 degrees C., more preferably 90 to 180 degrees C., for 0.1 to 3 hours, more preferably 0.5 to 2 hours.

The present silicone composition can bond strongly to an IC package upon cured, which can stably maintain flexibility with time, and does not detach from a substrate. A cured material obtained by curing the present silicone composition can better follow large warping of an IC package, while bonding to the IC package, compared to conventional silicone grease compositions, and maintains its flexibility, even left at a high temperature. Accordingly, semi-conductor devices with high reliability may be prepared.

EXAMPLES

The invention will be explained in detail with reference to the following Examples and Comparative Examples, but the invention shall not be restricted by the Examples.

The materials used in the Examples and the Comparative Examples will be explained below.

Component (A)

A-1: dimethylpolysiloxane having a dynamic viscosity at 25 degrees C. of 600=$^2$/5, both terminals of which are each capped with a dimethylvinylsilyl group.

A-2: dimethylpolysiloxane having a dynamic viscosity at 25 degrees C. of 30,000 mm$^2$/s, both terminals of which are each capped with a dimethylvinylsilyl group.

Component (B)

B-1: organohydrogenpolysiloxane represented by the following formula:

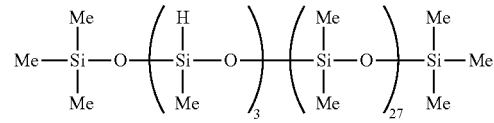

B-2: organohydrogenpolysiloxane represented by the following formula:

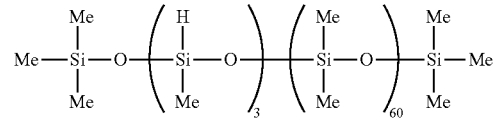

For comparison, the following organohydrogenpolysiloxanes were used.

B-3: organohydrogenpolysiloxane represented by the following formula:

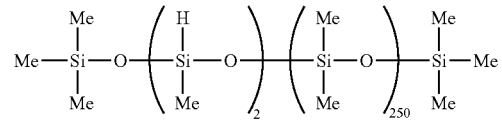

B-4: organohydrogenpolysiloxane represented by the following formula:

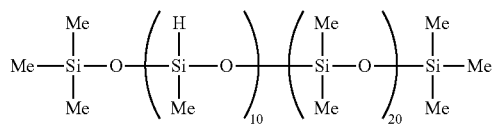

Component (C)

C-1: organohydrogenpolysiloxane represented by the following formula:

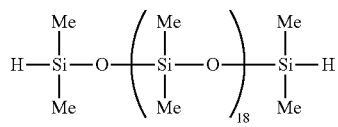

C-2: organohydrogenpolysiloxane represented by the following formula:

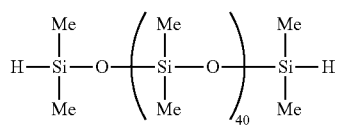

Component (D)

D-1: organohydrogensiloxane represented by the following formula:

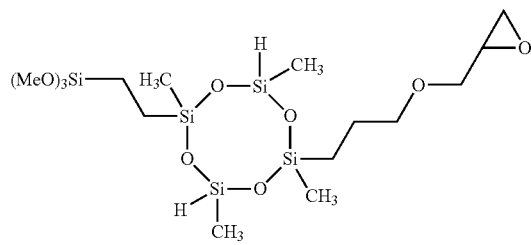

For comparison, the following organohydrogensiloxane was used.

D-2: organohydrogensiloxane represented by the following formula:

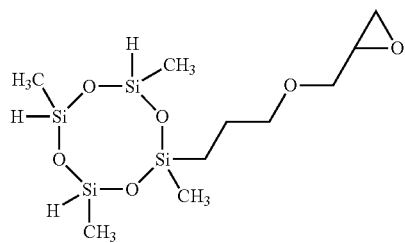 [SMILES: C[SiH]1O[SiH](C)O[Si](C)(CCCOCC2CO2)O[SiH](C)O1]

Component (E) Thermally Conductive Filler

The following fillers (1) to (6) were blended in the amounts indicated in the following Table 1 and mixed at room temperature for 15 minutes with a 5-liter gate mixer (5-Liter Planetary Mixer: trade name, ex Inoue Manufacturing Co.) to obtain E-1 through E-4 indicated in Table 1. Average particle diameters of E-1 through E-4 are as shown in Table 1.

(1) Aluminum powder with an average particle diameter of 15 micron m.
(2) Alumina powder with an average particle diameter of 70 micron m.
(3) Alumina powder with an average particle diameter of 40 micron m.
(4) Alumina powder with an average particle diameter of 10 micron m.
(5) Alumina powder with an average particle diameter of 1.0 micron m.
(6) Zinc oxide powder with an average particle diameter of 1.0 micron m.

TABLE 1

| | Amount, g | | | | | | Average |
|---|---|---|---|---|---|---|---|
| | Aluminum Powder 15 μm | Almina Powder 70 μm | Almina Powder 40 μm | Almina Powder 10 μm | Almina Powder 1.0 μm | Zinc Oxide Powder 1.0 μm | Particle Diameter, μm |
| E-1 | 700 | 0 | 0 | 0 | 0 | 200 | 12 |
| E-2 | 0 | 0 | 200 | 200 | 400 | 0 | 13 |
| E-3 | 0 | 0 | 0 | 700 | 0 | 200 | 8 |
| E-4 | 0 | 200 | 200 | 200 | 400 | 0 | 24 |

Component (F): Platinum-divinyltetramethyldisiloxane complex dissolved in the dimethylpolysiloxane described as A-1 above in a concentration of 1% as platinum atoms Component (G): 50% Solution of 1-ethyny-1-cyclohexanol in toluene Component (H): Organosilane represented by the following formula: $C_{10}H_{21}Si(OCH_3)_3$ Component (I): Organopolysilane represented by the following formula:

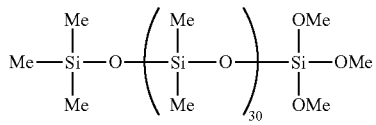

Component (J): Fumed silica surface-treated for hydrophobicity with dimethyldichlorosilane, having a BET specific surface area of 120 m²/g Preparation of a Silicone Composition Component (A) was put in a 5-liter gate mixer (5-Liter Planetary Mixer: trade name, ex Inoue Manufacturing Co.), to which components (E) thermally conductive filler and, when applicable, component (H) organosilane and component (I) organopolysiloxane were then added in the amounts indicated in Table 2 or Table 3, and mixed at 70 degrees C. for one hour. Subsequently, (G) reaction retardant was added in the amounts indicated in Table 2 or Table 3 and mixed at room temperature for 15 minutes. Then, component (F) catalyst was added in the amounts indicated in Table 2 or Table 3 and mixed at room temperature for 15 minutes to become homogeneous. Lastly, components (B), (C) and (D) were added in the amounts indicated in Table 2 or Table 3 and mixed at room temperature for 15 minutes to become homogeneous.

Physical properties of the compositions thus obtained were determined in the following manners. The results were as shown in Tables 2 and 3.

Thermal Conductivity

A thermal conductivity at 25 degrees C. of each of the silicone compositions was determined with a hot disc method thermal property-determining apparatus, TPA-501, ex Kyoto Electronic Industry Co.

Viscosity

An absolute viscosity at 25 degrees C. was determined with a Malcom viscometer, type PC-1T.

Shearing Tensile Strength of Bonding

A shearing tensile strength of bonding was determined according to JIS (Japanese Industrial Standards) K 6249. Specifically, the silicone composition layer is sandwiched between each one terminal area of two rectangular aluminum strips having a width of 25 mm with a gap of 2 mm, where a contact area was 25 mm by 10 mm=2.5 cm², and allowed to cure at 150 degrees C. for one hour to obtain a test piece. The two sides of the test piece were pulled by a tensile tester at a speed of 50 ram/minute to measure a shearing strength.

Flexibility

A hardness of a cured material obtained from the composition was measured with Asker C (for low hardness), ex Kobunshi Keiki Co. Its change with time was evaluated. Specifically, the silicone composition was poured into a mold with a depth of 10 mm, heated at 150 degrees C. for one hour to obtain a rubbery molded material in a sheet shape with a thickness of 10 mm, which was then allowed to be at a temperature of 25 degrees C. An initial hardness of the sheet was measured. Subsequently, the sheet was left at 150 degrees C. for 1,000 hours and then allowed to be at a temperature of 25 degrees C. A hardness of the sheet was again measured.

TABLE 2

| | | | Example | | | | | | | |
|---|---|---|---|---|---|---|---|---|---|---|
| | | | 1 | 2 | 3 | 4 | 5 | 6 | 7 | 8 |
| Amount, part by mass | A: Organopolysiloxane | A-1 | 100 | 100 | 100 | 100 | 100 | 100 | 100 | 100 |
| | | A-2 | 0 | 0 | 0 | 0 | 70 | 70 | 70 | 70 |
| | B: Organohydrogenpolysiloxane | B-1 | 4.6 | 4.6 | 3 | 0 | 6 | 3 | 6 | 4 |
| | | B-2 | 0 | 0 | 0 | 8 | 0 | 0 | 0 | 0 |
| | | B-3 | 0 | 0 | 0 | 0 | 0 | 0 | 0 | 0 |
| | | B-4 | 0 | 0 | 0 | 0 | 0 | 0 | 0 | 0 |
| | C: Organohydrogenpolysiloxane | C-1 | 6.6 | 6.6 | 7 | 0 | 7 | 5 | 10 | 9 |
| | | C-2 | 0 | 0 | 0 | 10 | 0 | 0 | 0 | 0 |
| | D: Organohydrogenpolysiloxane | D-1 | 0.5 | 0.5 | 1 | 0.8 | 0.8 | 0.5 | 0.8 | 1.5 |
| | | D-2 | 0 | 0 | 0 | 0 | 0 | 0 | 0 | 0 |
| | Si—H/S-Vi, ratio of the numbers | | 1.1 | 1.1 | 1.2 | 1 | 1.2 | 0.7 | 1.4 | 1.4 |
| | Si—H in Components (C) and (D)/Si—H in Component (B), ratio of the numbers | | 1.9 | 1.9 | 3.5 | 2.3 | 1.5 | 2.3 | 2.3 | 4 |
| | E: Thermally Conductive Filler | E-1 | 450 | 900 | 0 | 0 | 0 | 0 | 0 | 0 |
| | | E-2 | 0 | 0 | 1700 | 0 | 0 | 0 | 0 | 0 |
| | | E-3 | 0 | 0 | 0 | 1900 | 0 | 0 | 0 | 0 |
| | | E-4 | 0 | 0 | 0 | 0 | 1700 | 1700 | 1700 | 1700 |
| | F: Platinum Group Metal Catalyst | | 0.15 | 0.15 | 0.15 | 0.2 | 0.2 | 0.3 | 0.3 | 0.2 |
| | G: Reaction Retardant | | 0.45 | 0.45 | 0.45 | 0.4 | 0.45 | 0.5 | 0.5 | 0.4 |
| | H: organosilane | | 3 | 6 | 0 | 0 | 0 | 0 | 0 | 0 |
| | I: Organopolysiloxane | | 0 | 0 | 100 | 70 | 30 | 30 | 30 | 30 |
| | J: Fine Silica Powder | | 0 | 0 | 10 | 0 | 5 | 4 | 6 | 5 |
| Results | Viscosity, Pa · s | | 50 | 180 | 80 | 120 | 100 | 95 | 90 | 92 |
| | Thermal Conductivity, W/mK | | 2.12 | 3.65 | 2.3 | 2.43 | 2.7 | 2.82 | 2.53 | 2.72 |
| | Shearing Tensile Strength of Bonding, Mpa | | 0.09 | 0.1 | 0.15 | 0.12 | 0.23 | 0.09 | 0.18 | 0.13 |
| | Flexibility, initial hardness | | 4 | 15 | 10 | 12 | 30 | 8 | 27 | 10 |
| | Flexibility, hardness after aging* | | 10 | 25 | 15 | 18 | 35 | 11 | 37 | 16 |

*At 150 Degrees C. for 1,000 Hrs.

TABLE 3

| | | | Comparative Example | | | | | | | | |
|---|---|---|---|---|---|---|---|---|---|---|---|
| | | | 1 | 2 | 3 | 4 | 5 | 6 | 7 | 8 | 9 |
| Amount, part by mass | A: Organopolysiloxane | A-1 | 100 | 100 | 100 | 100 | 100 | 100 | 100 | 100 | 100 |
| | | A-2 | 0 | 0 | 70 | 70 | 70 | 70 | 0 | 0 | 70 |
| | B: Organohydrogenpolysiloxane | B-1 | 4.6 | 4 | 2 | 6 | 11 | 1.3 | 0 | 0 | 6 |
| | | B-2 | 0 | 0 | 0 | 0 | 0 | 0 | 0 | 0 | 0 |
| | | B-3 | 0 | 0 | 0 | 0 | 0 | 0 | 56.3 | 0 | 0 |
| | | B-4 | 0 | 0 | 0 | 0 | 0 | 0 | 0 | 1.3 | 0 |
| | C: Organohydrogenpolysiloxane | C-1 | 6.6 | 6 | 3 | 7 | 2 | 12 | 6.6 | 6.6 | 7 |
| | | C-2 | 0 | 0 | 0 | 0 | 0 | 0 | 0 | 0 | 0 |
| | D: Organohydrogenpolysiloxane | D-1 | 0 | 0 | 0.8 | 2.5 | 0.8 | 0.8 | 0.8 | 0.8 | 0.8 |
| | | D-2 | 0 | 1 | 0 | 0 | 0 | 0 | 0 | 0 | 0 |
| | Si—H/Si-Vi, ratio of the numbers | | 1.1 | 1.4 | 0.5 | 1.6 | 1.2 | 1.2 | 1.2 | 1.2 | 1.2 |
| | Si—H in Components (C) and (D)/Si—H in Component (B), ratio of the numbers | | 1.9 | 3.2 | 3 | 2.3 | 0.4 | 11 | 2.3 | 2.3 | 1.5 |
| | E: Thermally Conductive | E-1 | 900 | 0 | 0 | 0 | 0 | 0 | 900 | 900 | 0 |

TABLE 3-continued

| | | | Comparative Example | | | | | | | | |
|---|---|---|---|---|---|---|---|---|---|---|---|
| | | | 1 | 2 | 3 | 4 | 5 | 6 | 7 | 8 | 9 |
| | Filler | E-2 | 0 | 1700 | 0 | 0 | 0 | 0 | 0 | 0 | 0 |
| | | E-3 | 0 | 0 | 0 | 0 | 0 | 0 | 0 | 0 | 0 |
| | | E-4 | 0 | 0 | 1700 | 1700 | 1700 | 1700 | 0 | 0 | 3100 |
| | F: Platinum Group Metal Catalyst | | 0.15 | 0.15 | 0.2 | 0.2 | 0.2 | 0.2 | 0.15 | 0.15 | 0.2 |
| | G: Reaction Retardant | | 0.45 | 0.45 | 0.4 | 0.4 | 0.4 | 0.4 | 0.45 | 0.45 | 0.4 |
| | H: organosilane | | 6 | 0 | 0 | 0 | 0 | 0 | 6 | 6 | 0 |
| | I: Organopolysiloxane | | 0 | 100 | 30 | 30 | 30 | 30 | 0 | 0 | 100 |
| | J: Fine Silica Powder | | 0 | 10 | 5 | 5 | 5 | 5 | 0 | 0 | 0 |
| Results | Viscosity, Pa · s | | 180 | 83 | 120 | 95 | 97 | 94 | 78 | 220 | Not like grease |
| | Thermal Conductivity, W/mK | | 3.65 | 2.32 | 2.81 | 2.67 | 2.64 | 2.66 | 1.65 | 3.72 | — |
| | Shearing Tensile Strength of Bonding, Mpa | | 0 | 0.5 | 0 | 0.4 | 0.52 | 0 | 0 | 0.32 | — |
| | Flexibility, initial hardness | | 15 | 70 | Not cured | 34 | 80 | Not cured | Not cured | 60 | — |
| | Flexibility, hardness after aging* | | 22 | Exceed the measurement limit | Not cured | Exceed the measurement limit | Exceed the measurement limit | Not cured | Not cured | 78 | — |

*At 150 Degrees C. for 1,000 Hrs.

INDUSTRIAL APPLICABILITY

The cured material obtained by curing the present silicone composition has the better bonding property to substrates, compared to conventional thermally conductive silicone compositions and therefore, can better follow large warping of IC packages without detachment, and maintains its flexibility, even left at a high temperature. Accordingly, semiconductor devices with high reliability can be prepared.

The invention claimed is:

1. A silicone composition having a viscosity at 25 degrees C. of 10 to 1,000 Pa·s, and comprising
    (A) 100 parts by mass of an organopolysiloxane having at least two alkenyl groups per molecule and a dynamic viscosity at 25 degrees C. of 10 to 100,000 mm$^2$/s,
    (B) an organohydrogenpolysiloxane represented by the following formula (1):

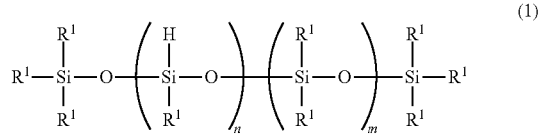

(1)

wherein n and m are positive integers which meet the equations:
    10≤n+m≤100 and 0.01≤n/(m+n) ≤0.3, and
    R$^1$ is, independently of each other, an alkyl group having 1 to 6 carbon atoms,
    (C) an organohydrogenpolysiloxane represented by the following formula (2):

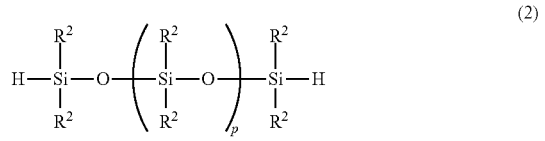

(2)

wherein p is a positive integer of from 5 to 1,000, and R$^2$ is, independently of each other, an alkyl group having 1 to 6 carbon atoms, (D) an organohydrogenpolysiloxane represented by the following formula (3):

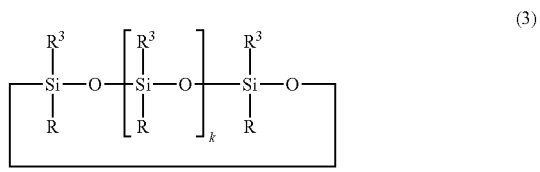

(3)

wherein k is a positive integer of from 2 to 10; R is, independently of each other, a hydrogen atom or R$^4$, provided that two of R are a hydrogen atom, wherein R$^4$ is a group bonded to a silicon atom via a carbon atom or via a carbon atom and an oxygen atom and has a group selected from an epoxy group, an acryloyl group, a methacryloyl group, an ether group and a trialkoxysilyl group, R$^3$ is, independently of each other, an alkyl group having 1 to 6 carbon atoms,
    (E) 400 to 3,000 parts by mass of a thermally conductive filler,
    (F) a catalytic amount of a platinum group metal catalyst, and
    (G) 0.01 to 1 part by mass of a reaction retardant,
    wherein amounts of components (B), (C) and (D) meet the following conditions:
        a ratio, [the total number of Si—H groups in components (B), (C) and (D)]/[the number of alkenyl groups in component (A)], is in a range of 0.6 to 1.5;
        a ratio, [the total number of Si—H groups in components (C) and (D)]/[the number of Si—H groups in component (B)], is in a range of 1 to 10; and
        a ratio, [the number of Si—H groups in component (C)]/[the number of Si—H groups in component (D)], is in a range of 1 to 10.

2. The silicone composition according to claim 1, wherein component (D) is an organohydrogenpolysiloxane represented by the following formula (4):

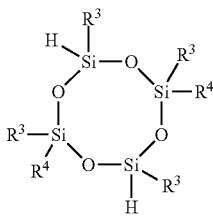

(4)

wherein $R^3$ and $R^4$ are as defined above.

3. The silicone composition according to claim 1, wherein the reaction retardant is selected from acetylene compounds, nitrogen compounds, organic phosphorus compounds, oxime compounds, and organic chloro compounds.

4. The silicone composition according to claim 1, wherein the composition further comprises (H) organosilane represented by the following formula (5) in an amount of 0.01 to 30 parts by mass per 100 parts by mass of component (A),

(5)

wherein $R^5$ is, independently of each other, a monovalent hydrocarbon group having 6 to 15 carbon atoms; $R^6$ is, independently of each other, a saturated or unsaturated monovalent hydrocarbon group having 1 to 8 carbon atoms; $R^7$ is, independently of each other, a monovalent hydrocarbon group having 1 to 6 carbon atoms; and a is an integer of 1 to 3, and b is an integer of 0 to 2, with a total of a and b being an integer of 1 to 3.

5. The silicone composition according to claim 1, wherein the composition further comprises an organopolysiloxane represented by the following formula (6) in an amount of 0.01 to 200 parts by mass per 100 parts by mass of component (A),

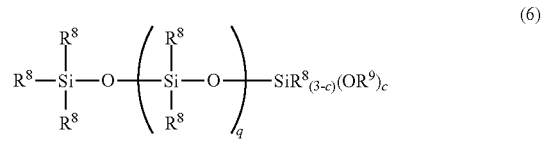

(6)

wherein $R^8$ is, independently of each other, unsubstituted or substituted, monovalent hydrocarbon group having 1 to 18 carbon atoms; $R^9$ is, independently of each other, selected from alkyl, alkoxyalkyl, alkenyl and acyl groups having 1 to 5 carbon atoms; and q is an integer of from 5 to 100, and c is an integer of from 1 to 3.

6. The silicone composition according to claim 1, wherein the composition further comprises (J) fine silica powder in an amount of 0.1 to 200 parts by mass per 100 parts by mass of component (A).

7. A semi-conductor device provided with a cured material obtained by curing the silicone composition according to claim 1.

* * * * *